(12) United States Patent
Vukovic

(10) Patent No.: US 6,254,745 B1
(45) Date of Patent: *Jul. 3, 2001

(54) IONIZED PHYSICAL VAPOR DEPOSITION METHOD AND APPARATUS WITH MAGNETIC BUCKET AND CONCENTRIC PLASMA AND MATERIAL SOURCE

(75) Inventor: Mirko Vukovic, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/253,116

(22) Filed: Feb. 19, 1999

(51) Int. Cl.[7] .................................................. C23C 14/34
(52) U.S. Cl. ........................... 204/298.06; 204/298.11; 204/298.16; 204/298.19
(58) Field of Search .................. 204/192.12, 298.06, 204/298.16, 298.19, 298.11; 118/723, 723 I

(56) References Cited

U.S. PATENT DOCUMENTS

| | | | |
|---|---|---|---|
| 4,990,229 | * 2/1991 | Campbell et al. | 204/298.06 |
| 5,178,739 | * 1/1993 | Barnes et al. | 204/192.12 |
| 5,346,579 | * 9/1994 | Cook et al. | 204/298.16 |
| 5,496,455 | * 3/1996 | Dill et al. | 204/192.12 |
| 5,569,363 | * 10/1996 | Bayer et al. | 204/192.32 |
| 5,669,975 | 9/1997 | Ashtiani | 118/723 I |
| 5,744,011 | * 4/1998 | Okubo et al. | 204/192.12 |
| 5,763,851 | * 6/1998 | Forster et al. | 204/298.11 |
| 5,800,688 | * 9/1998 | Lantsman et al. | 204/298.11 |

FOREIGN PATENT DOCUMENTS 61-190070    8/1986    (JP).

* cited by examiner

Primary Examiner—Rodney G. McDonald
(74) Attorney, Agent, or Firm—Wood, Herron & Evans, L.L.P.

(57) ABSTRACT

Ionized physical vapor deposition (IPVD) is provided by a method of apparatus for sputtering conductive metal coating material from a magnetron sputtering target that is preferably annular. The sputtered material is ionized in a processing space between the target and a substrate by generating a dense plasma in the space with energy reactively coupled, preferably from a coil located outside of the vacuum chamber behind a dielectric window in the chamber wall at the center of the opening in the sputtering target. Chamber pressures are above 1 mTorr, typically in the 10–100 mTorr range, preferably between 10 and 20 mTorr. A magnetic bucket formed of an array of permanent magnets is positioned behind the inner surface of the chamber wall between the material source and the substrate. The bucket forms a multi-cusp field that operates as a magnetic mirror and functions in the IPVD system environment to repel charged particles moving from the plasma to the chamber wall, thereby increasing plasma confinement and improving the plasma density and uniformity and the ionization fraction of the coating material. The magnetic bucket preferably is formed of an array of ring shaped magnets spaced axially along the chamber wall. Alternatively, an array of axial extending bar magnets spaced circumferentially may be provided.

16 Claims, 3 Drawing Sheets

IONIZED PHYSICAL VAPOR DEPOSITION METHOD AND APPARATUS WITH MAGNETIC BUCKET AND CONCENTRIC PLASMA AND MATERIAL SOURCE

This invention relates to the Ionized Physical Vapor Deposition (IPVD) and, more particularly, to a method and apparatus by which coating material that is supplied is ionized to improve the directionality of the coating material onto the substrates.

BACKGROUND OR THE INVENTION

Ionized physical vapor deposition (IPVD) is a process which has particular utility in filling and lining high aspect ratio structures on silicon wafers. In ionized physical vapor deposition for deposition of thin coatings on semiconductor wafers, materials to be deposited are sputtered or otherwise vaporized from a source and then a substantial fraction of the vaporized material is converted to positive ions before reaching the wafer to be coated. This ionization is accomplished by a high-density plasma which is generated in a process gas in a vacuum chamber. The plasma may be generated by magnetically coupling RF energy through an RF powered excitation coil into the vacuum of the processing chamber. The plasma so generated is located in a region between the source and the wafer. Electrostatic forces affect the positive ions of coating material and direct them toward the various surfaces in the chamber. By applying a negative bias to the wafer, positive ions are attracted from the plasma to the wafer. Such a negative bias may either arise with the wafer electrically isolated by reason of the immersion of the wafer in a plasma or by the application of an RF voltage to the wafer. The bias causes ions of coating material to be accelerated toward the wafer so that an increased fraction of the coating material deposits onto the wafer at angles approximately normal to the wafer. This allows the deposition of metal over wafer topography including in deep and narrow holes and trenches on the wafer surface, providing good coverage of the bottom and sidewalls of such topography.

Certain IPVD systems are disclosed in U.S. patent application Ser. Nos. 08/844,751, now U.S. Pat. No. 5,878,423 Ser. No. 08/837,551 now U.S. Pat. No. 5,800,688 and Ser. No. 08/844,756 filed Apr. 21, 1997 now abandoned, assigned to the assignee of the present application. The disclosures of these applications are hereby expressly incorporated by reference herein. Such systems include a vacuum chamber which is typically cylindrical in shape and provided with part of its curved outer wall formed of a dielectric material or window. A helical electrically conducting coil is disposed outside the dielectric window and around and concentric with the chamber, with the axial extent of the coil being a significant part of the axial extent of the dielectric wall. In operation, the coil is energized from a supply of RF power through a suitable matching system. The dielectric window allows the energy from the coil to be coupled into the chamber while isolating the coil from direct contact with the plasma. The window is protected from metal coating material deposition by an arrangement of shields, typically formed of metal, which are capable of passing RF magnetic fields into the interior region of the chamber, while preventing deposition of metal onto the dielectric window that would tend to form conducting paths for circulating currents generated by these magnetic fields. Such currents are undesirable because they lead to ohmic heating and to reduction of the magnetic coupling of plasma excitation energy from the coils to the plasma. The purpose of this excitation energy is to generate high-density plasma in the interior region of the chamber. A reduction of coupling causes the plasma density to be reduced and process results to deteriorate.

In such IPVD systems, material is sputtered from a target, which is charged negatively with respect to the plasma, usually by means of a DC power supply. The target is often of a planar magnetron design incorporating a magnetic circuit or other magnet structure which confines a plasma over the target for sputtering the target. The material from the target arrives at a wafer supported on a wafer support or table to which a bias is typically applied, often by means of an RF power supply connected to the substrate support through an impedance matching network.

A somewhat different IPVD geometry employs a plasma generated by a coil placed internal to the vacuum chamber. Such a system does not require dielectric chamber walls nor special shields to protect the dielectric walls. Such a system is described by Barnes et al. in U.S. Pat. No. 5,178,739, expressly incorporated by reference herein. Systems with coils outside of the chamber, as well as the system disclosed in the Barnes et al. patent, involve the use of inductive coils or other coupling elements, either inside or external to the vacuum, that are physically positioned and occupy space between the planes of the sputtering target and the wafer.

Whether a coupling element such as a coil is provided inside or outside of a vacuum chamber, dimensions of the system have been constrained by the need for adequate source-to-substrate separation to allow for the installation of the RF energy coupling elements between the source and the substrate. Adequate diameter must also be available around the wafer for installation of coils or other coupling elements. As a direct result of the increased source-to-substrate spacing due to the need to allow space for the coupling element, it is difficult to achieve adequate uniformity of deposition with such systems. If the height of the chamber is reduced to improve uniformity there is a loss of plasma density in the central region of the chamber and the percentage ionization of the coating material is reduced. Also, in practice, the entire system must fit within a constrained volume. As a result, there are frequently problems due to heating arising from the proximity of the RF coils to walls and other metal surfaces, which may necessitate extra cooling, which increases engineering and production costs and wastes power.

An IPVD apparatus with the coil in the chamber has the additional disadvantage that the coils are eroded by the plasma and must therefore consist of target grade material of the same type as that being sputtered from the target. Moreover, considerable cooling of coils placed in the vacuum chamber is needed. If liquid is used for this cooling of the coils, there is danger that the coils will be penetrated by uneven erosion or by arcing, causing a resulting leak of liquid coolant into the system, which is highly undesirable and will likely result in a long period of cleaning and requalification of the system. Furthermore, an excitation coil in the chamber also couples capacitively to the plasma, leading to inefficient use of the excitation power and to the broadening of the ion energy spectrum, which may have undesirable effects on the deposition process.

As a result of many of the above considerations, a method and an apparatus for ionized physical vapor deposition have been proposed by Drewery and Licata in the commonly assigned and copending U.S. Pat. No. 6,080,287 hereby expressly incorporated by reference herein. The method and the apparatus described in the Drewery et al. application provides for the efficient coupling of energy into the dense plasma by which coating material is ionized in IPVD processing systems, and does so without interfering with the optimum geometry of the chamber and without placing a coil or other coupling element into the vacuum chamber. It uses an apparatus provided with a ring-shaped source of coating material such as an annular sputtering target having at its center a coupling element such as a flat coil behind a dielectric window for coupling RF energy into the chamber to produce a high density reactively coupled plasma such as an inductively coupled plasma (ICP).

IPVD systems and methods such as those described above benefit from a high plasma density and plasma uniformity to efficiently achieve their objectives, particularly the objective of coating sub-micron high aspect ratio features. Higher plasma density leads to increased metal ionization. Improved plasma uniformity also reduces the effects of bias, for example RF bias produced by an RF source, on deposition uniformity and widens the acceptable range of other process parameters. Various of the systems described above are prone to loss of effectiveness due to a loss of ions to the walls of the chamber and as a result improving plasma uniformity.

In plasma systems of the types that do not involve IPVD, various techniques have been tried for reducing the loss of ions to the chamber walls. In low temperature plasma generation, for example, one approach to improving plasma uniformity and increase plasma density is the use of a "magnetic bucket". Magnetic fields of the type produced by magnetic buckets reduce the electron flux to the walls of a processing chamber by a type of confinement called magnetic mirror confinement. The tendency of the plasma to stay neutral, that is to have the same number of electrons as positive ions, reduces the ion flux to the walls as well. The different process chamber configurations of the systems discussed above each present problems in achieving plasma density and uniformity. Magnetic mirrors and magnetic buckets interact adversely with magnetron fields and degrade target utilization. This has made them less suitable for cases where high plasma density and uniformity are required, such as for IPVD.

For these and other reasons, there is a need to improve the deposition uniformity and increase plasma density in IPVD systems, including those with ICP plasma sources situated at the center of an annular target.

SUMMARY OF THE INVENTION

An objective of the present invention is to provide an IPVD method and an IPVD apparatus in which plasma that functions to ionize coating material will more fully, densely and uniformly fill the portion of the processing chamber through which the coating material passes on its way to the substrate. It is a further objective of the present invention to enhance the coating material ionizing plasma without undue increase in the complexity of cathode and magnetron design. It is a particular objective of the present invention to provide a method and apparatus in which plasma flux into the walls of the chamber are magnetically reduced and, more particularly, in which plasma density and plasma uniformity are improved thereby.

In accordance with the principles of the present invention, an ionized physical vapor deposition (IPVD) apparatus is provided with an external array of magnets, preferably a magnetic bucket array of permanent magnets, arranged around the circumference of a coating chamber to repel moving charged particles from plasma that are moving toward the walls of the chamber. The invention preferably employs a magnetic bucket arrangement of permanent magnets around the circumference of an IPVD chamber that has a ring shaped source of coating material at one end and a substrate facing the source at the other. In the preferred embodiment of the invention, the ring-shaped source of coating material has an RF coupling element such as a coil at or behind its center that reactively couples energy into the chamber to sustain a dense plasma within the chamber for ionizing coating material from the source. The source may have a magnetron magnet behind or adjacent it to shape the sputtering plasma and control the erosion profile of the source, particularly when in the form of an annular sputtering target.

Further in the preferred embodiment, the magnet array includes a plurality of permanent magnets having their polar axes oriented radially relative to the axis of the chamber. The directions of polarity of the magnets of the array alternate so as to produce a multi-cusp field around the walls of the chamber. The magnets may be in the form of a cage of axially oriented magnet bars that collectively form a ring of axially extending tunnels of field lines close to the surface of the chamber walls as in the case of a more conventional magnetic bucket structure. However, in the preferred embodiment of the invention, the magnet array is in the form of a stack of axially spaced circumferential rings concentric with the chamber axis and forming ring shaped magnetic tunnels around the circumference of the chamber. With such an arrangement, the field interaction with the cathode is azimuthally uniform. The field lines converge and the field thereby strengthens within the chamber with the proximity to the chamber wall, which has the effect of repelling charged particles moving toward the walls of the chamber along the lines of the magnetic field.

The magnet array produces a field that is strong enough to magnetize electrons at the plasma edge, that is, is strong enough to deflect electrons that are moving in the field. The field from the magnets does not, on the other hand, have sufficient strength to penetrate substantially into the body of the plasma. For IPVD systems such as those to which the present invention relates, chamber pressures are generally necessarily above 1 mTorr, typically in the 10–100 mTorr range. For pressures in the 10–20 mTorr range in argon gas, such a magnetic field may be up to approximately 50–100 Gauss in strength. With pressures of about 100 mTorr, field strengths may be up to about 200–300 Gauss. Generally, however, pressures should not be higher than necessary so as not to penetrate too far into the plasma, but the B field (in Gauss) should be at least about 1.3 times the pressure (in milli-Torr). Preferably, the field strength is about 30% higher than this minimum level.

The magnets are spaced close enough together to create what is known as a magnetic bottle, where the field lines from one magnet of the array extend from one pole of the magnet to the other pole of the magnet through the adjacent magnets on each side, which have the opposite polar orientations. Spacing the magnets too far apart destroys the effectiveness of the array, while closer spacing avoids excessive field penetration into the plasma body and reduces the coupling of the magnet array to the cathode magnetic field.

The magnets are located as close as possible to the chamber wall, making them more effective in preventing charged particle losses to the chamber wall. Preferably, the magnets are placed in the vacuum in the chamber behind the chamber wall liners or shields rather than behind the outer wall of the chamber outside of the vacuum. A cooling gas or other cooling fluid may be useful in cooling the magnets. Where the magnets are in the presence of RF fields from coils or other elements by which energy is supplied to sustain the plasma, the magnets may be protected with suitable coatings, such as copper or aluminum coatings, of sufficient thickness to shield the magnets to prevent their overheating from the RF fields. With 13.56 MHZ RF energy, coatings of at least 20–50 microns, and preferably 80–100 microns, of copper or aluminum are suitable.

In the preferred embodiment of the invention, an IPVD chamber is provided with an annular target at one end, a substrate support at the other end, and an RF coil situated at the opening in the center of the target. An array of permanent magnets circles the chamber at the chamber wall. The array is centered on the axis of the chamber that extends through the center of the target and the substrate. Preferably the array is a magnetic bucket array in the form of annular magnet rings having their polar axes extending radially about the chamber axis. The rings are thin flat rings closely spaced in the axial direction with their polar axes alternating along the length of the chamber. The rings are preferably located inside of the vacuum of the chamber between the chamber wall and a removable wall liner of the type usually provided to intercept deposits from the chamber and to facilitate the cleaning of the inside of the chamber. The wall liner may be a closed cylinder of metallic or other conductive but non-magnetic material.

In an alternative embodiment, the array may also be in the form of a magnetic bucket array formed of straight axially extending permanent magnet strips closely spaced angularly in the circumferential direction, also with their polar axes oriented radially relative to the axis of the chamber. The axial magnet array is also preferably situated between the chamber wall and a chamber wall liner, although, in each array configuration, the magnets can be situated outside of the chamber, but such arrangement is believed to be less effective. With the array of axial extending magnets, more coupling results than with circumferentially extending magnets between the array magnets and magnetron magnets that are typically present in the cathode assembly behind the annular target. As a result, reoptimization of the design of the cathode magnets must be undertaken after addition of the magnet bucket array, which is less desirable although conventional magnetron optimization techniques may be used.

The provision of a magnetic bucket for an IPVD processor having an RF element such as a coil at the center of an annular target to excite a dense low energy coating material ionizing plasma increases the effectiveness of the plasma. Repulsion by the magnetic bucket of electrons that would otherwise escape to the chamber wall prevents the loss of electrons from the plasma. This reduces the ion flux to the chamber walls and enhances ion density and uniformity of the plasma. This high ion density increases metal ionization and reduces power requirements on the RF source. Plasma uniformity is improved, reducing RF bias effects on deposition uniformity and reducing the constraints on other process parameters.

These and other objectives and advantages of the present invention will be more readily apparent from the following detailed description of the drawings.

DETAILED DESCRIPTION OF THE INVENTION

Figure 1:
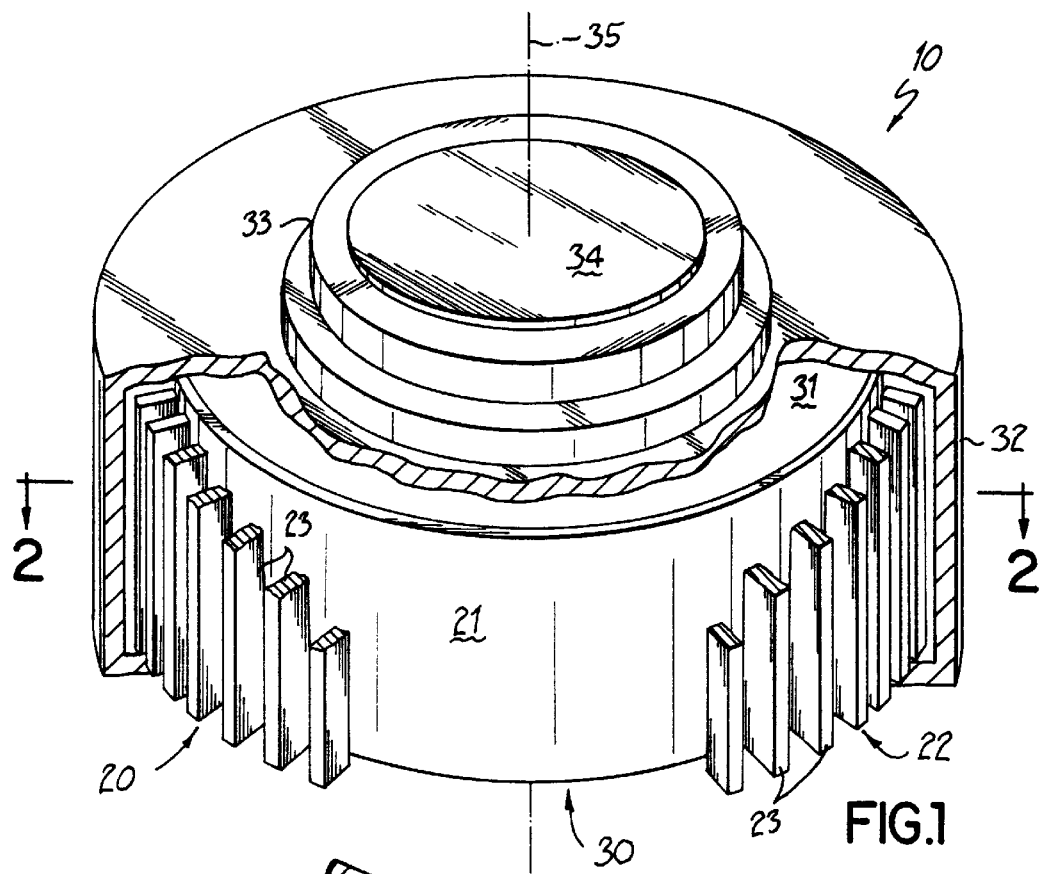
FIG. 1 is a perspective view of an IPVD processing apparatus according to one embodiment of the present invention.

FIG. 1 shows an ionized physical vapor deposition (IPVD) apparatus 10 that includes a conventional magnetic bucket magnet assembly 20 in combination with the IPVD processor 30 of the type described in U.S. Pat. No. 6,080,287 that is incorporated by reference herein. The processor 30 includes a vacuum chamber 31 surrounded by a sealed chamber wall 32 having an annular sputtering target and cathode assembly 33 at one end thereof and a substrate support (not shown) at the other. The chamber 31 has a central axis 35 that extends through the centers of the cathode assembly 33 and of the substrate support. The chamber wall 31 is generally cylindrical and concentric with the axis 35. In the center of the annular target and cathode assembly 33, centered on the axis 35, is an RF generator 34 for coupling a high density low energy plasma into the chamber 31.

A typical PVD processor is provided with a removable liner inside of the wall to intercept coating material that would deposit on the wall and facilitate the cleaning of the chamber by allowing the liner to be removed for cleaning. In the apparatus 10, the processor 30 is provided with a liner 21 spaced inwardly from the chamber wall 32 a small distance, preferably about ½ inch, where the chamber wall 32 is about 15 inches in diameter.

The magnetic bucket 20 includes an array 22 of magnets 23 each formed of a magnetic bar having a length slightly less than the height of the chamber 31. Each magnet has a polar axis oriented radially with respect to the chamber 31, as represented by the N and S designations in FIG. 2. That is, one pole is located at the radially inner edge of the bar of the magnet 23, and the other pole is located at the radially outer edge of the bar of the magnet 23. Therefore, an even number of magnets 23 is provided. Each of the bars may be made of a single magnet or may be formed of a row of small discrete magnets assembled on a common strip, which strip may be made of, for example, iron.

In the preferred dimensions, the magnets 23 are about ⅜ inch thick in the radial direction and about ⅛ to ³⁄₁₆ inch thick in the circumferential direction. Such magnets 23 are also preferably spaced about ⅛ to ¼ inch apart, with about 120 magnets 23 encircling the chamber 31. The magnets 23 extend between the chamber wall 32 and shield 21, which are both formed of a non-magnetic material, both of which may be electrically conductive. In any event, a sufficient area of the chamber that is in proximity to the plasma should be either grounded or maintained at the chamber anode potential.

Figure 2:
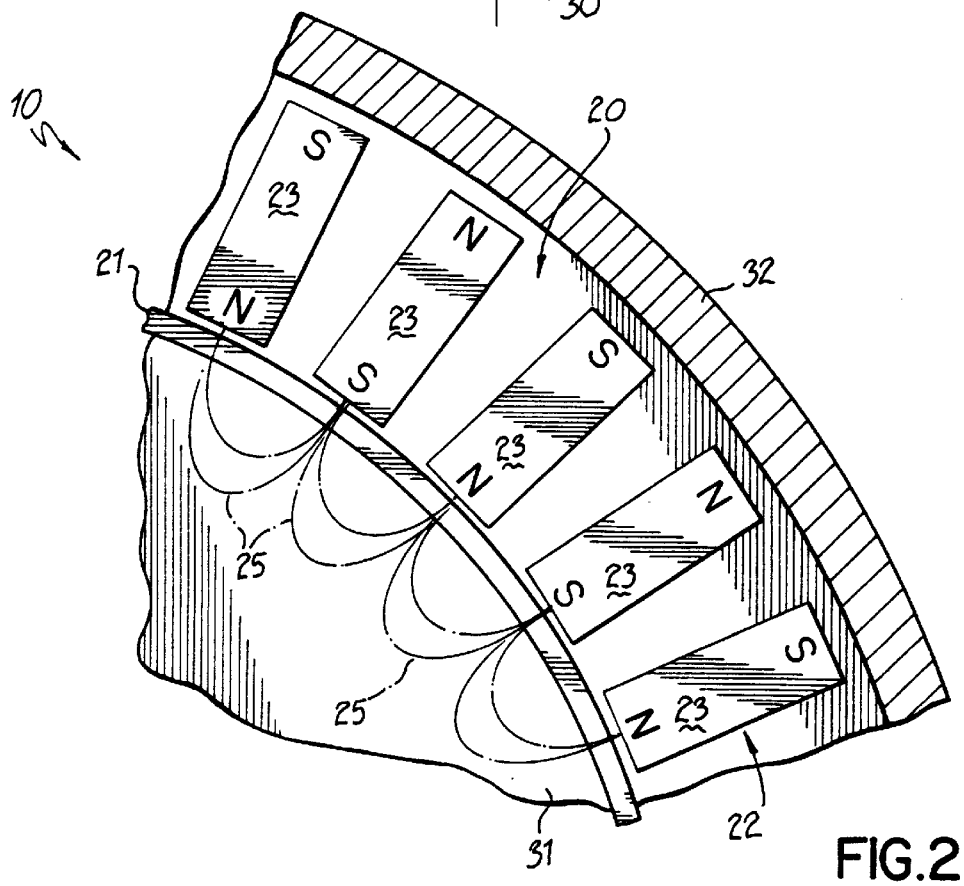
FIG. 2 is a partial cross-sectional diagram along line 2—2 of FIG. 1.

As illustrated in FIG. 2, magnetic field lines 25 arch from the inner edges of each of the magnets 23 to the inner edges of the immediately adjacent magnets 23, which are of the opposite polarity. The field lines 25 converge as they approach the poles of the magnets 23, so that electrons moving parallel to the field lines experience a repulsive force as they move closer to the magnet poles, thereby being deflected back into the chamber 31.

Figure 3:
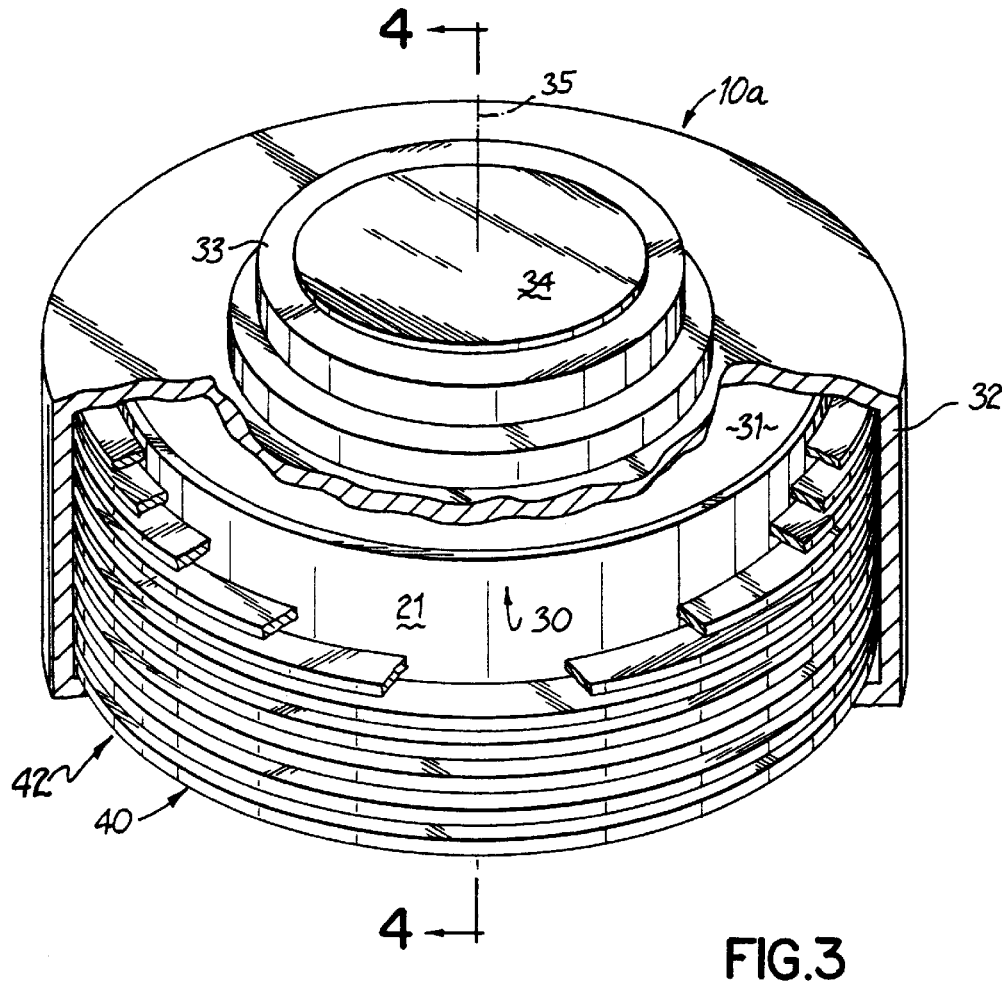
FIG. 3 is a perspective view similar to FIG. 1 of an IPVD processing apparatus according to another and preferred embodiment of the present invention.
Figure 4:
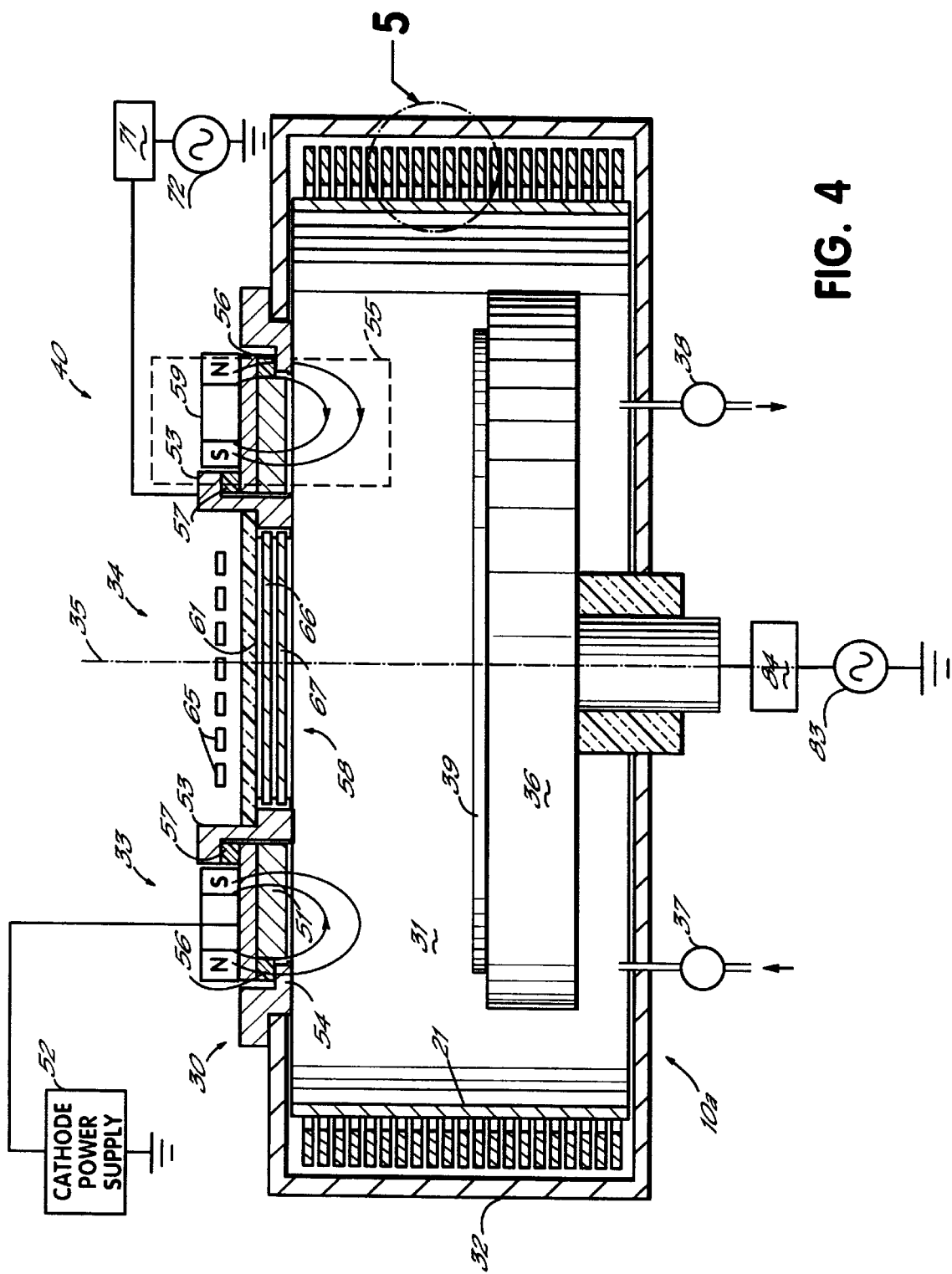
FIG. 4 is a cross-sectional diagram along line 4—4 of FIG. 2.

FIGS. 3 and 4 illustrate a preferred embodiment of an ionized physical vapor deposition (IPVD) apparatus 10a that includes a modified magnetic bucket type magnet assembly 40 in combination with the IPVD processor 30 of U.S. Pat. No. 6,080,287 all embodiments of which are suitable but only one of which is described in detail in this application. The processor 30 includes a vacuum chamber 31 surrounded by the sealed chamber wall 32. An annular sputtering target and cathode assembly 33 is located at one end of the chamber 31, and a substrate support 36 is located at the other end of the chamber 31 parallel to the target and cathode assembly 33. The central axis 35 extends through the center of the cathode assembly 33 and the substrate support 36. The chamber wall 32 is preferably symmetric about and centered on the axis 35, and may be generally concentric with the axis 35. In the center of the annular target and cathode assembly 33, centered on the axis 35, is the RF generator 34.

As illustrated in FIG. 4, the target and cathode assembly 35 preferably includes a generally annular target 51 which, in operation, is charged negatively by a cathode power supply 52, which is preferably in the form of either a DC or pulsed DC power supply, or may be in the form of an RF supply connected to the target 51 through a suitable matching network. The erosion of the target 51 is controlled by inner and outer dark space rings 53,54 and preferably, also by magnetic fields generated by a magnetron magnet assembly 59 as schematically shown in the region 55. Cooling of the target 51 may be achieved by the use of internal water channels or other cooling fluid ports (not shown) or by immersion in a suitable external cooling system (not shown), which are conventional. The target 51 is electrically isolated from grounded surfaces by the insulators 56,57. The annular target 51 has an inner opening 58 in which is mounted an RF plasma excitation system 34. Typically, a gas source 37 is provided to the processor 30 to supply a processing gas, such as argon, to the chamber 31, while a vacuum pump 38 maintains the chamber 31 at the desired vacuum.

The RF excitation system 34 preferably includes a planar dielectric window 61 which seals the opening of the annular target 51. The side of the window 61 that is facing a substrate 39 on the support 36 is in contact with the vacuum of the chamber 31, while the opposite side or outer face of the window 61 is in contact with a nominally atmospheric environment. Near the outer face of the window 61 is an excitation coil 65 which preferably extends in a direction parallel to the window 61 and may be planar or substantially planar. Suitable coils 65 are, for example, described in U.S. Pat. No. 4,948,458 granted to Ogle and in U.S. Pat. No. 5,669,975 granted to Ashtiani, both expressly incorporated by reference herein. On the interior side of the window 61 is a shield or plurality of shields 66, 67, which physically protect the dielectric window 61 from deposition of sputtered material while also serving as a Faraday shield that allows the passage of inductively coupled RF energy from the coil 65 into the chamber 31. The shields 66,67 are mounted a small distance apart and close to the inside surface of the dielectric window 61. The shields 66,67 are preferably slotted and may be electrically grounded to, and maintained in good thermal contact with, the dark space shield 53, which is preferably water cooled. Alternatively, one or both of the shields 66,67 may be electrically floating, at least with respect to RF energy on the coil 65. In the preferred embodiment, the shields 66,67 are cooled by conduction from the edges, either to the dark space shield 53 which is water-cooled, or through an optional electrically insulating and thermally conductive supporting ring (not shown) that would allow cooling of the shields 66,67 while electrically insulating the shields 66,67 from the dark space shield 53, if desired. Other shield cooling techniques and arrangements of shields can be employed.

In operation, an RF voltage is supplied by a power supply 72 through a matching network 71 to the excitation coil 65. Techniques for design of the matching unit and certain connections so as to minimize undesirable capacitive coupling to the shields 66,67 are described in U.S. Pat. No. 5,669,975 to Ashtiani. Process gases are supplied to raise the pressure in the chamber to about 10 to 100 mTorr. A high-density plasma can then be ignited in the chamber. DC or RF power is supplied to the sputtering target 51, which is eroded by ion bombardment from the main plasma. The material sputtered from the target by the main plasma is ionized as it passes through the high density plasma supported by the inductively coupled energy from the coil 65. This ionized sputtered coating material is accelerated towards the substrate or wafer 39 which is preferably negatively biased, such as with a high frequency RF generator 83 connected to the substrate support 36 through a matching network 84.

In the embodiment 10$a$, the magnetic bucket 40 includes an array 42 of magnets 43 each formed of a magnetic ring having an outside diameter that is approximately equal to or slightly less than the inside diameter of the chamber wall 32 and an inside diameter that is approximately equal to or slightly larger than the outside diameter of the shield 21. The magnets 43 are arranged in a stack that extends slightly less than the height of the chamber 31. Each magnet 43 has a polar axis oriented radially with respect to the chamber 31, as represented by the N and S designations in FIG. 5. That is, one pole is located at the radially inner edge of the ring of the magnet 43, and the other pole is located at the radially outer edge of the bar of the magnet 43. The preferred dimensions of the rings of the magnets 43 are about $3/8$ inches in the radial direction, about $1/8$ to $3/16$ inch thick in the axial direction and with spacings between the rings in the axial direction of about $3/16$ inch apart, so that the number of magnet rings is about 16 to 24, depending on the height of the chamber 31. As with the magnets 20 in the embodiment described above, the magnetic ring-shaped magnets 40 may each be made of a single ring-shaped magnet or may be formed of a plurality of small discrete magnets assembled on a common ring. Such a ring may be made of iron and the magnets either mechanically fastened to the ring or held there by magnetic attraction.

Figure 5:
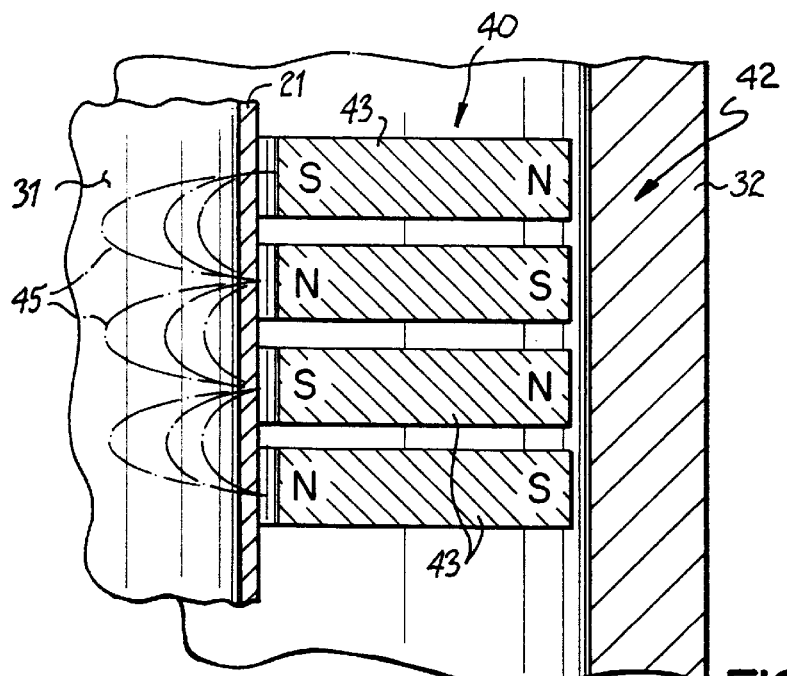
FIG. 5 is an enlarged cross sectional view of a portion of the magnetic bucket structure of the IPVD apparatus of FIG. 4.

As illustrated in FIG. 5, magnetic field lines 45 arch from the inner edges of each of the magnets 43 to the inner edges of the immediately adjacent magnets 43, which are of the opposite polarity. The field lines 45 converge as they approach the poles of the magnets 43, so that electrons moving parallel to the field lines experience a repulsive force as they move closer to the magnet poles, thereby being deflected back into the chamber 31. With the magnets 43 of embodiment 10$a$, the field lines 45 form closed annular arches around the perimeter of the liner 21 and the field lines from the magnets lie in planes that extend through the chamber axis 35. With the magnets 23 of embodiment 10, the field lines 25 form tunnel-shaped segments at the perimeter of the chamber 31 that each extend parallel to the chamber axis 35, and the field lines lie in planes perpendicular to the axis 35 and parallel to the substrate holder and the target assembly 33. As a result, the embodiment 10$a$ has less effect on the magnetron magnet field of the cathode assembly 33, and therefore requires less special design reoptimization due to the adding of the magnetic bucket to the apparatus.

Those skilled in the art will appreciate that the implementation of the present invention herein can be varied, and that the invention is described in preferred embodiments.

Accordingly, additions and modifications can be made without departing from the principles and intentions of the invention.

What is claimed is:

1. An ionized physical vapor deposition apparatus comprising:

a vacuum chamber having a processing space therein maintained at a vacuum pressure suitable for performing IPVD in the chamber, an axis through the processing space, and a chamber wall having a wall liner inside of the chamber between the processing space and the chamber wall, the wall liner providing an inside surface surrounding the vacuum processing space and the axis;

a source of coating material generally centered on the axis at one end of the chamber from which coating material is supplied to the processing space;

the source of coating material including:

at least one annular sputtering target of coating material having a sputtering surface in communication with the inside of the chamber and a target power supply connected to the target to supply a DC potential to the sputtering surface that is sufficiently electrically negative relative to the plasma to sputter material from the sputtering surface of the target into the processing space, and a magnetron magnet behind the target outside of the chamber effective to confine a sputtering plasma in close proximity to the sputtering surface of the target;

a substrate support inside of the chamber generally centered on the axis at the opposite end of the processing space from the source of coating material;

an RF energy source;

an RF coupling element connected to the RF energy source generally centered on the axis operative to reactively couple energy to form a plasma in the processing space that is sufficiently dense to ionize coating material moving from the source of coating material through the processing space;

a magnetic bucket generally centered on the axis and surrounding the axis and the processing space, the magnetic bucket including an array of axially spaced permanent annular ring magnets centered on the axis and encircling the chamber inside of the chamber between the wall liner and the chamber wall, the magnets each having a radially oriented polar axis, the magnets of the array being arranged with alternating polarities and being closely spaced to produce a magnetic field of multiple axially spaced annular cusps extending around the chamber close to the wall liner so as to repel charged particles approaching the wall from the plasma, the magnetic bucket being effective to produce a magnetic field in the processing space at said inside surface having an approximate strength in Gauss of at least 50 Gauss and of at least about 1.3 times the pressure in mTorr within the chamber when said pressure is between about 10 and 100 mtorr; and a non-magnetic electrically highly conductive material between the magnets and the processing space.

2. The apparatus of claim 1 wherein:

the magnetic field produced by the magnetic bucket has an approximate strength in Gauss at the inside of the inner surface of the chamber wall of from about 1.3 times the pressure in milli-Torr to not more than the greater of 5 times the pressure in milli-Torr or 300 Gauss.

3. The apparatus of claim 1 wherein:

the magnets of the array are flat rings of between about ⅛ and about ¼ inch in axial thickness and between about ⅜ and about ¾ inch in radial width and are spaced between about ⅛ and about ¼ inch apart and the array extends more than about ⅔ the axially length of the chamber between the source of coating material and the substrate.

4. The apparatus of claim 1 wherein the non-magnetic electrically highly conductive material includes:

a non-magnetic highly electrically conductive material coating on each of the magnets of the magnetic bucket.

5. The apparatus of claim 1 wherein:

the source of coating material is a ring-shaped source from which coating material is supplied to the processing space, the ring-shaped source having a central opening and at least one surface in communication with the vacuum processing space;

the RF coupling element is situated at the central opening of the ring shaped source to reactively couple energy into the chamber to form a plasma in the processing space that is sufficiently dense to ionize coating material moving from the ring-shaped source through the processing space.

6. The apparatus of claim 5 wherein:

the RF coupling element is a coil situated at the central opening of the ring shaped source to inductively couple energy into the chamber to form an inductively coupled plasma in the processing space.

7. The apparatus of claim 5 further comprising:

a dielectric window at the central opening of the source; and the RF coupling element being situated outwardly of and behind the window outside of the vacuum of the chamber and is operative to couple RF energy through the window into the chamber to energize a plasma in the chamber.

8. The apparatus of claim 7 further comprising:

shield structure inside of the window between the window and the processing space, the shield being configured to permit the effective coupling of RF energy from the coupling element into the processing space and to physically shield the window from coating material from the processing space.

9. The apparatus of claim 1 further comprising:

a bias power supply connected to the substrate support so as to produce a DC potential on a substrate on the support that is sufficiently negative relative to the plasma to direct positive ions of coating material from the processing space toward the substrate.

10. The apparatus of claim 1 wherein:

the annular sputtering target is a target of electrically conductive coating material.

11. A sputtering apparatus comprising:

a vacuum chamber having a processing space therein maintained at a vacuum pressure suitable for performing a sputtering process on a wafer in the chamber, an axis through the processing space, and a chamber wall having an inside surface surrounding the vacuum processing space and the axis;

the chamber wall having a wall liner spaced from the wall and inside of the chamber between the processing space and the chamber wall;

a substrate support inside of the chamber generally centered on the axis;

a sputtering target generalist centered on the axis in the end of the chamber opposite the substrate support, the target having a sputtering surface in communication with the inside of the chamber;

a magnetron magnet behind the target and configured to confine a sputtering plasma in close proximity to the sputtering surface of the target;

an RF energy source;

an RF coupling element connected to the RF energy source generally centered on the axis and operative to reactively couple energy to form a plasma in the processing space;

a magnetic bucket generally centered on the axis and surrounding the axis and the processing space, the magnetic bucket including an array of axially spaced permanent annular ring magnets centered on the axis and encircling the chamber inside of the chamber between the sputter shield and the chamber wall, the magnets each having a radially oriented polar axis, the magnets of the array being arranged with alternating polarities and being closely spaced to produce a magnetic bottle type magnetic field of multiple spaced cusps extending around the chamber close to the wall liner so as to repel charged particles moving toward the wall from the plasma; and a non-magnetic highly electrically conductive material between the magnets and the processing space.

12. The apparatus of claim 11 wherein the non-magnetic electrically highly conductive material includes:

a non-magnetic highly electrically conductive material coating on each of the magnets of the magnetic bucket.

13. The apparatus of claim 11 wherein the wall liner is formed of the non-magnetic electrically highly conductive material to thereby provide said non-magnetic highly electrically conductive material between the magnets and the processing space.

14. The apparatus of claim 1 wherein:

the magnetic non-magnetic conductive material includes a material selected from the group consisting of copper and aluminum and is from 20 to 100 microns thick.

15. The apparatus of claim 1 wherein:

the magnetic non-magnetic conductive material includes a material selected from the group consisting of copper and aluminum and is from 20 to 100 microns thick.

16. The apparatus of claim 15 wherein:

the magnetic non-magnetic conductive material includes a material selected from the group consisting of copper and aluminum and is at least 80 microns thick.

* * * * *

UNITED STATES PATENT AND TRADEMARK OFFICE
CERTIFICATE OF CORRECTION

PATENT NO. : 6,254,745 B1
DATED : July 3, 2001
INVENTOR(S) : Mirko Vukovic

It is certified that error appears in the above-identified patent and that said Letters Patent is hereby corrected as shown below:

Column 11,
Line 1, reads "generalist" and should read -- generally --.

Column 12,
Line 16, reads "The apparatus of Claim 1 wherein:" and should read -- The apparatus of Claim 11 wherein: --.

Signed and Sealed this

Sixth Day of August, 2002

Attest:

JAMES E. ROGAN
Attesting Officer        Director of the United States Patent and Trademark Office